United States Patent
Schultz

(10) Patent No.: US 8,563,425 B2
(45) Date of Patent: Oct. 22, 2013

(54) SELECTIVE LOCAL INTERCONNECT TO GATE IN A SELF ALIGNED LOCAL INTERCONNECT PROCESS

(75) Inventor: Richard T. Schultz, Ft. Collins, CO (US)

(73) Assignee: Advanced Micro Devices, Sunnyvale, CA (US)

( * ) Notice: Subject to any disclaimer, the term of this patent is extended or adjusted under 35 U.S.C. 154(b) by 523 days.

(21) Appl. No.: 12/475,796

(22) Filed: Jun. 1, 2009

(65) Prior Publication Data
US 2010/0304564 A1   Dec. 2, 2010

(51) Int. Cl.
*H01L 21/4763* (2006.01)
(52) U.S. Cl.
USPC .................................. 438/637; 257/E2.641
(58) Field of Classification Search
USPC .......................... 438/666, 637; 257/E21.641
See application file for complete search history.

(56) References Cited

U.S. PATENT DOCUMENTS

| | | | |
|---|---|---|---|
| 5,247,456 A * | 9/1993 | Ohe et al. ...................... 716/102 |
| 6,214,656 B1 | 4/2001 | Liaw | |
| 6,232,222 B1 | 5/2001 | Armacost | |
| 6,274,471 B1 | 8/2001 | Huang | |
| 6,300,178 B1 | 10/2001 | Sunouchi | |
| 7,115,491 B2 * | 10/2006 | Huang et al. ................... 438/586 |
| 2001/0046737 A1 | 11/2001 | Ahn | |
| 2003/0100159 A1 | 5/2003 | Houston | |
| 2007/0034968 A1 * | 2/2007 | Nishida et al. ................. 257/369 |
| 2008/0145980 A1 * | 6/2008 | Kim et al. ...................... 438/160 |

OTHER PUBLICATIONS

International Search Report and Written Opinion in application No. PCT/US2010/036793 mailed Sep. 6, 2010.
U.S. Appl. No. 12/475,989, entitled SRAM Bit Cell With Self-Aligned Bidirectional Local Interconnects, filed Jun. 1, 2009.

* cited by examiner

*Primary Examiner* — Shaun Campbell
(74) *Attorney, Agent, or Firm* — Meyertons Hood Kivlin Kowert & Goetzel; Gareth M. Sampson

(57) ABSTRACT

A semiconductor device fabrication process includes forming a gate of a transistor on a semiconductor substrate using a hard mask. The hard mask is selectively removed in one or more selected regions over the gate. The removal of the hard mask in the selected regions allows the gate to be connected to an upper metal layer through at least one insulating layer located substantially over the transistor. Conductive material is deposited in one or more trenches formed through the at least one insulating layer. The conductive material forms a local interconnect to the gate in at least one of the selected regions.

20 Claims, 10 Drawing Sheets

SELECTIVE LOCAL INTERCONNECT TO GATE IN A SELF ALIGNED LOCAL INTERCONNECT PROCESS

BACKGROUND OF THE INVENTION

1. Field of the Invention

This invention relates generally to semiconductor processes for forming transistors and, more specifically, to processes for forming local interconnects to a gate of either a planar or nonplanar transistor on a semiconductor substrate.

2. Description of the Related Art

Transistors such as planar transistors have been the core of integrated circuits for several decades. During the use of transistors, the size of the individual transistors has steadily decreased through advances in process development and the need to increase feature density. Current scaling employs 32 nm technologies with development also progressing towards 22 nm and 15 nm technologies.

Development in 15 nm process technology is producing the need for self-aligned contact to gate or self-aligned local interconnect to gate flow in the transistor. A self-aligned process is needed to avoid contact to gate shorts and allow channel length scaling at 15 nm. In addition, other problems may be associated with the fact that the metal layer is likely to be unidirectional SIT (sidewall image transfer). Thus, a means to pull the metal (e.g., metal 1) output port layer on an output away from the transistor cell border may be needed to achieve a manufacturable metal tip to tip spacing to a neighboring cell without a 1 CPP (contact-to-poly-pitch) area penalty.

Currently, there is development in using self-aligned contact to gate flow. This process flow, however, for 15 nm technology may require 2 steps to print a mask for contact to gate separate from 2 steps to print a mask for contact to source/drain due to the resolution constraints of the stepper used to print the patterns used in the masks. The contact to gate process may also require at least one additional metal layer to complete cell routes over current technologies because the metal layer has to be unidirectional.

Currently, there has been little development in the use of selective or self-aligned local interconnects to gate. It is not possible to easily split a local interconnect layer into separate mask sets (as is done for the contact to gate process) because not all local interconnect routes are to be connected to the gate even though some local interconnect routes may pass over the gate. Further, decomposition of the local interconnect pattern is not likely possible without severe design rule restrictions and/or other disadvantages.

Thus, there is a need for a process flow that allows selective local interconnect to be routed over the field and make a connection to the gate or not make a connection to the gate within the transistor cell. The process flow described herein may accomplish manufacturable metal tip to tip spacing to the neighboring cell without the 1 CPP area penalty by allowing routing of the local interconnect back from the output and back over to the gate without connecting to the gate. The local interconnect may then be connected to a via interconnect layer and to a metal (e.g., metal 1) layer while maintaining acceptable metal tip to tip spacing with the neighboring cell. The local interconnect line width may be less than a nominal target for the metal layer so that there may be more tolerance at the same pitch in a double pattern approach or a SIT based approach for local interconnect.

The process flow described herein allows a pattern to define areas where the local interconnect routes over the gate and a connection to the gate is desired as well as define areas where local interconnect routes over the gate and no connection to the gate is desired. This allows the local interconnect to be a routing layer over field and help make connections within the transistor cell. Such routing of the local interconnect may improve the density of the routing layout since the local interconnect spacing to a gate can be zero or less than zero. Without using the process flow described herein, gate tip to local interconnect spacing may have to be at least one full routing pitch or more away from the gate tip to avoid gate to local interconnect shorts or leakage as no routes over gates without making a connection would be allowed.

Using EUV (extreme ultraviolet) instead of current techniques (such as immersion lithography or 193 nm lithography) may allow patterning without the need for pitch splitting or double patterning. Even with the use of EUV lithography, however, pattern decomposition would likely still be needed for routing with self-aligned local contacts. The use of EUV and local interconnect routing with the process flow described herein may, however, eliminate the need for pattern decomposition and/or the use of double patterning or pitch splitting.

SUMMARY

In certain embodiments, a semiconductor device fabrication process includes selectively removing a hard mask in one or more selected regions over a gate of a transistor on a semiconductor substrate. The removal of the hard mask in the selected regions may allow the gate to be connected to an upper metal layer through at least one insulating layer located substantially over the transistor. Conductive material may be deposited in one or more trenches formed through the at least one insulating layer. The conductive material may form a local interconnect to the gate in at least one of the selected regions.

In some embodiments, the selective removal of the hard mask is accomplished using a CAD (computer-aided design) designed resist pattern that defines the selected regions. In some embodiments, the selected regions include regions located above the gate at desired locations for making connections to the gate through the at least one insulating layer. In certain embodiments, the conductive material is deposited into at least one trench formed through the at least one insulating layer above a region where the hard mask has not been removed. The hard mask may inhibit connection between the conductive material and the gate in such trench.

In one embodiment, the semiconductor device fabrication process includes forming a gate of a transistor on a semiconductor substrate using a hard mask, placing a gate hard mask etch pattern over the transistor, selectively removing the hard mask in one or more selected regions over the gate using the gate hard mask etch pattern, forming a first insulating layer over the transistor, forming a second insulating layer over the transistor, forming a trench to the first insulating layer through the second insulating layer in at least one of the selected regions over the gate, removing the portion of the second insulating layer below the trench such that the gate is exposed in the trench, and depositing conductive material in the trench, wherein the conductive material forms a local interconnect to the gate in at least one of the selected regions.

In one embodiment, the semiconductor device fabrication process includes forming a gate of a transistor on a semiconductor substrate using a hard mask, forming a first insulating layer over the transistor, forming a second insulating layer over the transistor, forming a trench to the first insulating layer through the second insulating layer in one or more selected regions over the gate, removing the portion of the second insulating layer below the trench such that the gate and the hard mask are exposed in the trench, placing a gate hard mask etch pattern over the transistor, selectively removing the hard mask in the selected regions over the gate using the gate hard mask etch pattern, and depositing conductive material in the trench, wherein the conductive material forms a local interconnect to the gate in at least one of the selected regions.

In certain embodiments, a computer readable storage medium stores a plurality of instructions which, when executed, generates one or more resist patterns used to selectively remove a hard mask in one or more selected regions over a gate of a transistor on a semiconductor substrate. The removal of the hard mask in the selected regions allows the gate to be connected to an upper metal layer through at least one insulating layer located substantially over the transistor. Conductive material may be deposited in one or more trenches formed through the at least one insulating layer. The conductive material may form a local interconnect to the gate in at least one of the selected regions.

While the invention is described herein by way of example for several embodiments and illustrative drawings, those skilled in the art will recognize that the invention is not limited to the embodiments or drawings described. It should be understood that the drawings and detailed description hereto are not intended to limit the invention to the particular form disclosed, but on the contrary, the invention is to cover all modifications, equivalents and alternatives falling within the spirit and scope of the present invention as defined by the appended claims. Any headings used herein are for organizational purposes only and are not meant to limit the scope of the description or the claims. As used herein, the word "may" is used in a permissive sense (i.e., meaning having the potential to) rather than the mandatory sense (i.e. meaning must). Similarly, the words "include", "including", and "includes" mean including, but not limited to.

DETAILED DESCRIPTION OF THE EMBODIMENTS

Figure 1:
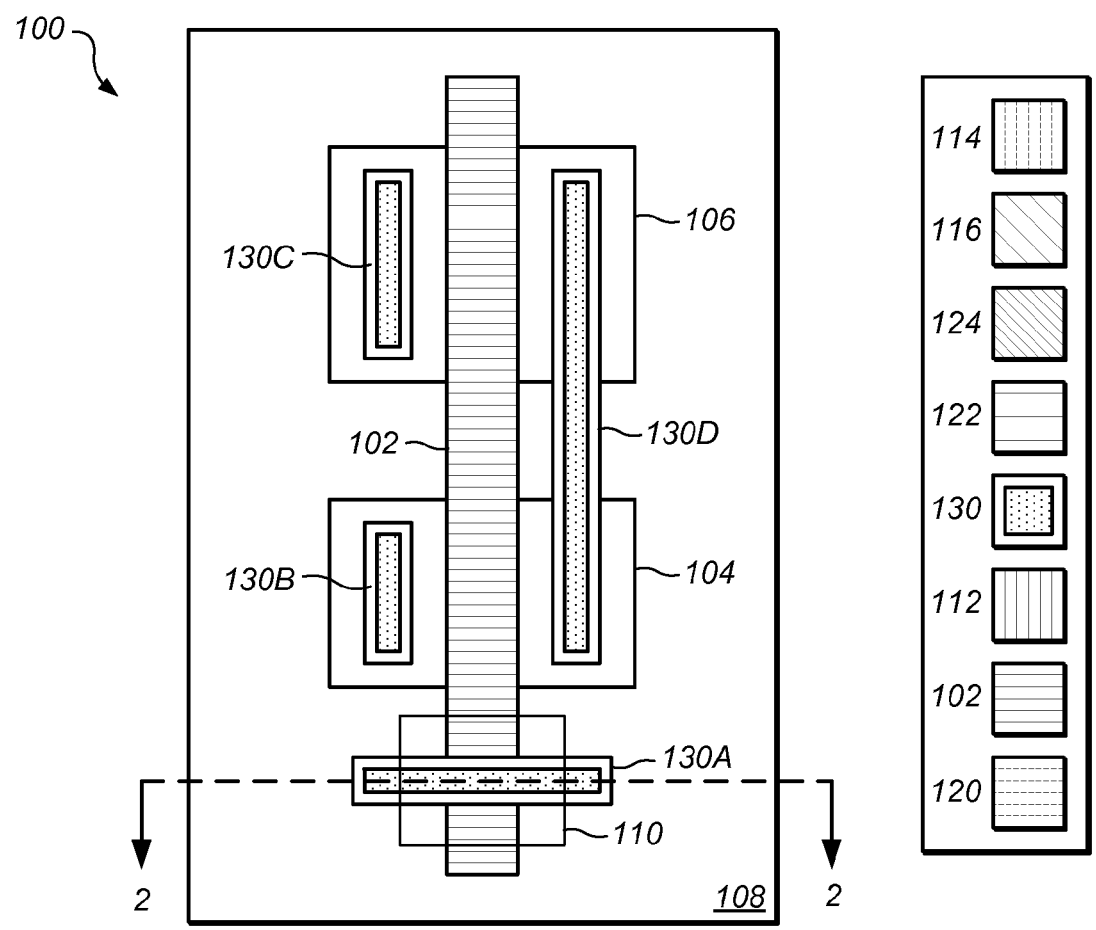
FIG. 1 depicts a top view of an embodiment of a transistor with a gate hard mask etch pattern.

FIG. 1 depicts a top view of an embodiment of transistor 100 with a gate hard mask etch pattern placed over the transistor. Transistor 100 may be, for example, a planar transistor (e.g., a planar field effect transistor (FET)) or a nonplanar transistor such as a FinFET transistor.

In certain embodiments, transistor 100 includes gate 102, first active region 104, and second active region 106. In one embodiment, first active region 104 is an N-active region and second active region 106 is a P-active region. For simplicity in FIG. 1, first active region 104 and second active region 106 are shown for a planar transistor; however, the areas for the active regions shown in FIG. 1 may also represent or include fins or other structures in a nonplanar transistor. As shown in FIG. 1, portions of transistor 100 to the left of gate 102 form the source of the transistor and portions of the transistor to the right of the gate form the drain of the transistor.

In certain embodiments, first resist pattern 108 is placed (e.g., formed or deposited) over transistor 100. In certain embodiments, first resist pattern 108 is a CAD (computer-aided design) designed pattern (e.g., a CAD designed resist pattern). In certain embodiments, a computer readable storage medium stores a plurality of instructions which, when executed, generates resist patterns or mask designs such as, but not limited to, the CAD designed resist pattern (e.g., first resist pattern 108).

In certain embodiments, first resist pattern 108 includes one or more openings 110. First resist pattern 108 and openings 110 may form a gate hard mask etch pattern for transistor 100. Openings 110 in first resist pattern 108 allow material exposed below the openings to be removed (e.g., etched). First resist pattern 108 may be designed such that openings 110 define selected regions over transistor 100 or gate 102 for removal of the gate hard mask and/or spacers to expose the gate or other underlying structure. For example, as shown in FIG. 1, opening 110 may allow the gate hard mask and spacer to be removed over a portion of gate 102 at a location removed from first active region 104 and second active region 106. Removing the gate hard mask and spacer at the location of opening 110 exposes the gate below the opening, which allows a connection to the gate to be made at the location.

In certain embodiments, openings 110 in first resist pattern 108 are located a selected distance from features (e.g., openings) in another pattern on formed on the same substrate. In some embodiments, the selected distance is greater than the resolution of an instrument used to form the patterns. In some embodiments, the selected distance is less than the resolution of the instrument used to form patterns. In such embodiments, double patterning (double exposures) may be used to produce the patterns on the substrate and increase the feature density (reduce spacing between features) in the patterns. In some embodiments, it may be possible to use only a single exposure (single pattern) to achieve the patterns. For example, multiple etch patterns may be merged on the single mask if the patterns are 1 contact-to-poly-pitch (CPP) apart and the merged patterns are subject to only a 2 CPP penalty requirement.

Figure 2:
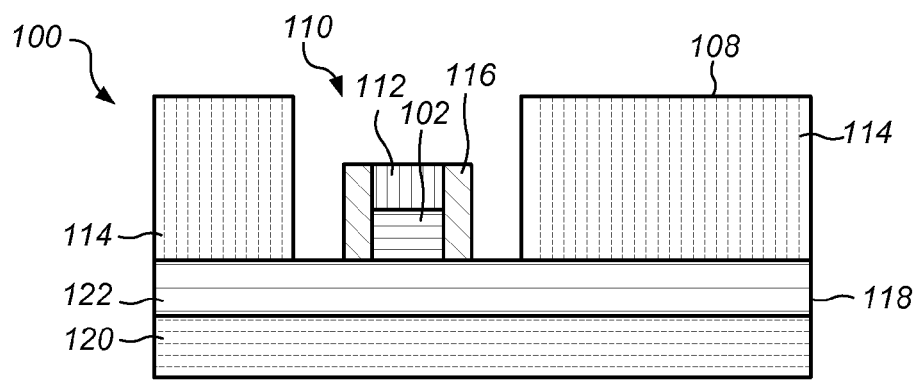
FIG. 2 depicts a cross-sectional side view of an embodiment of a gate and hard mask of a transistor with a gate hard mask etch pattern in place.

FIGS. 2-12 depict an embodiment of a process for forming a self-aligned local interconnect to gate 102. FIG. 2 depicts a cross-sectional side view (the cross-section taken along the dashed line shown in FIG. 1) of an embodiment of gate 102 and gate hard mask 112 with first resist pattern 108 formed by resist 114. Opening 110 in first resist pattern 108 is shown between resist structures 114. Opening 110 exposes gate 102, gate hard mask 112, and spacer 116, which have been formed on substrate 118. As shown in FIG. 2, substrate 118 is a silicon on insulator (SOI) substrate that includes silicon 120 and oxide 122. Substrate 118 may be, however, any other suitable semiconductor substrate such as, but not limited to, a bulk silicon substrate or a bulk compound semiconductor substrate.

In certain embodiments, gate 102 is metal or polysilicon or another suitable conductive material. Gate hard mask 112 and spacer 116 may be nitrides, oxides, or other suitable insulating materials. In certain embodiments, gate hard mask 112 and spacer 116 are different insulators that can be selectively etched relative to each other (e.g., an etch process may be used to remove one material while not removing the other material). For example, gate hard mask 112 may be a nitride (e.g., silicon nitride) while spacer 116 is an oxide (e.g., silicon oxide), or vice versa.

Figure 3:
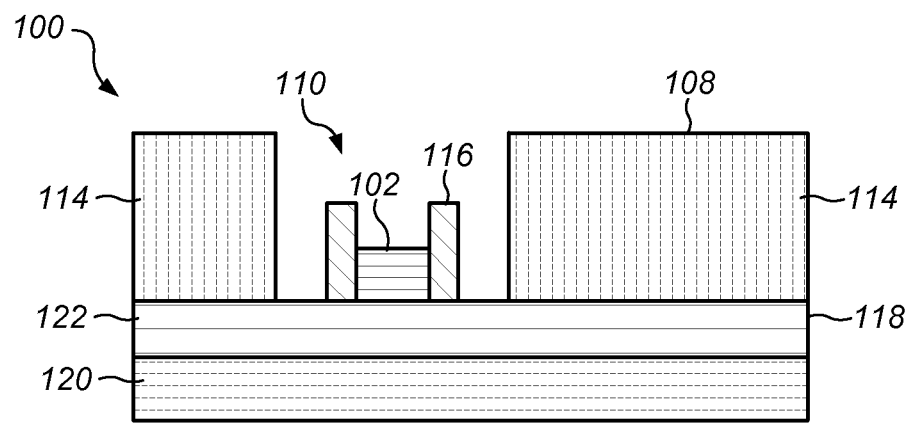
FIG. 3 depicts a cross-sectional side view of an embodiment of a gate of a transistor after the hard mask has been removed.

After first resist pattern 108 is formed on substrate 118 by deposition of resist 114, as shown in FIG. 2, gate hard mask 112 may be removed (etched) to expose gate 102. FIG. 3 depicts transistor 100 with the gate hard mask removed and gate 102 exposed. Because of the selectivity of first resist pattern 108, only selected portions of gate hard mask 112 exposed by opening 110 are removed. Thus, as shown in FIG. 1, the gate hard mask on portions of gate 102 near and over first active region 104 and second active region 106 are not removed and no connection will be made to the gate at these locations.

Figure 4:
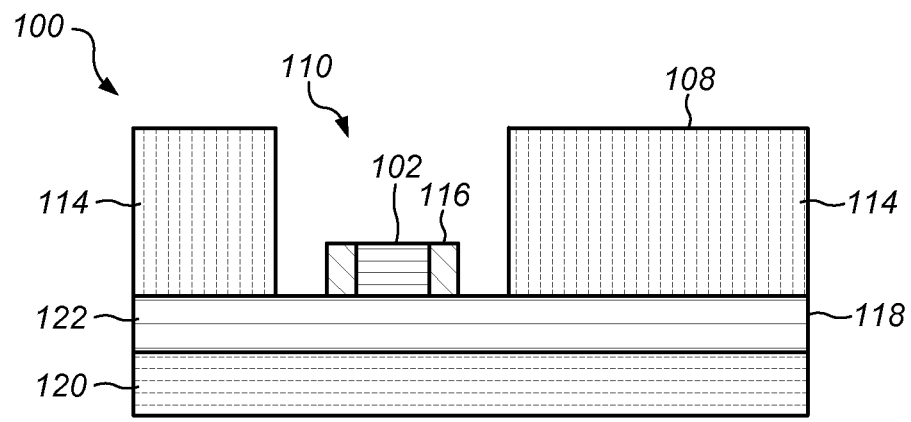
FIG. 4 depicts a cross-sectional side view of an embodiment of a gate of a transistor after the spacer has been etched back.

Following removal of the gate hard mask, at least a portion of spacer 116 may be removed (etched) back to be substantially planar with the top surface of gate 102. FIG. 4 depicts transistor 100 with the gate hard mask removed and spacer 116 etched back.

Figure 5:
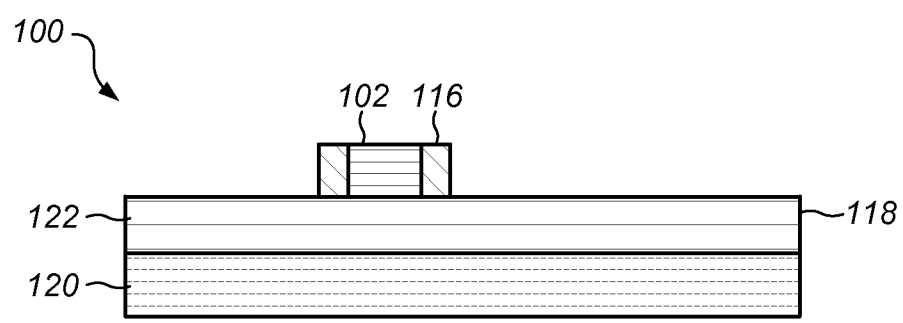
FIG. 5 depicts a cross-sectional side view of an embodiment of a gate of a transistor after removal of the gate hard mask etch pattern.

After gate 102 is exposed and spacer 116 is etched back, resist 114 may be removed, thus, removing first resist pattern 108 from transistor 100. FIG. 5 depicts transistor 100 with the resist removed leaving gate 102 with spacer 116 on substrate 118.

Figure 6:
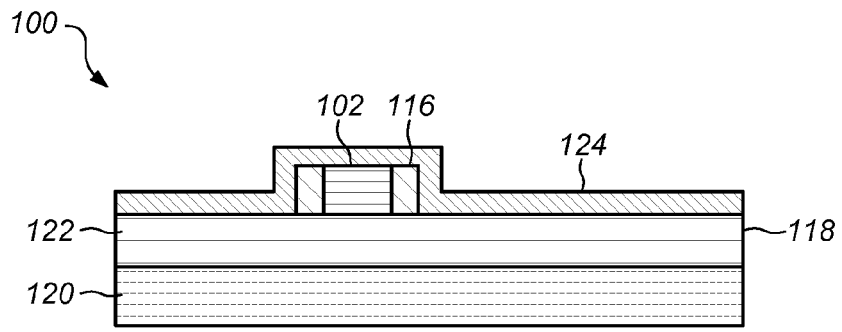
FIG. 6 depicts a cross-sectional side view of an embodiment of a gate of a transistor with a contact etch stop layer deposited over the transistor.

After removal of the resist, a first insulating layer may be formed (deposited) on substrate 118 over gate 102 and spacer 116. FIG. 6 depicts first insulating layer 124 formed over gate 102 and spacer 116 on substrate 118. First insulating layer 124 may be an insulating layer such as, but not limited, to an oxide or a nitride layer. In certain embodiments, first insulating layer 124 is a contact etch stop layer (CESL) or strain layer. First insulating layer 124 may be formed using techniques known in the art such as, but not limited to, rapid thermal processing or plasma deposition.

Figure 7:
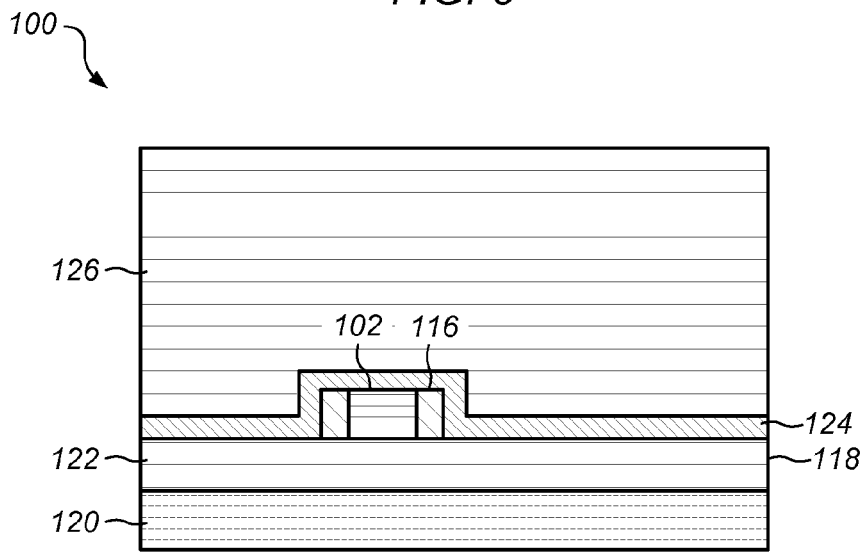
FIG. 7 depicts a cross-sectional side view of an embodiment of a gate of a transistor with an insulation layer deposited over the transistor.

FIG. 7 depicts the formation (deposition) of second insulating layer 126 over first insulating layer 124. In certain embodiments, second insulating layer 126 is a thicker insulating layer of the same insulating material or a similar insulating material to first insulating layer 124. In some embodiments, first insulating layer 124 and second insulating layer 126 are formed from different materials.

Figure 8:
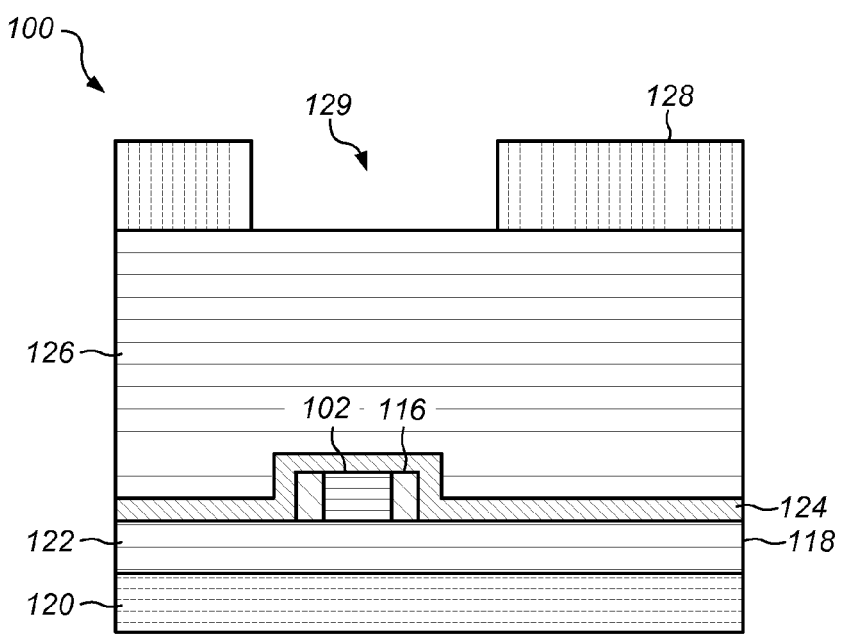
FIG. 8 depicts a cross-sectional side view of an embodiment of a gate of a transistor with an insulation layer deposited over the transistor and a trench lithography pattern formed over the insulation layer.

After deposition of first insulating layer 124 and second insulating layer 126, a second resist pattern is formed on the second insulating layer. FIG. 8 depicts second resist pattern 128 formed on second insulating layer 126. Second resist pattern 128 defines a pattern for formation of trenches through first insulating layer 124 and second insulating layer 126 to allow at least one local interconnect to connect to gate 102.

FIG. 8 depicts second resist pattern 128 with opening 129 for forming a trench for one local interconnect to gate 102. It is to be understood that second resist pattern 128 may include additional openings that allow additional trenches, holes, or routes to be formed through first insulating layer 124 and/or second insulating layer 126 at other locations (e.g., above first active region 104 and/or second active region 106, as shown in FIG. 1). Because these additional trenches may be formed above portions of the gate where the gate hard mask has not been removed, however, no connection to the gate will be made (as shown, for example, in FIG. 14). These additional trenches may, however, be used to provide a routing layer over the field oxide and, for example, make local connections in a library cell. For example, as shown in FIG. 1, local interconnects 130 may include local interconnect 130A to gate (aligned with opening 110 in first resist pattern 108), local interconnect 130B to source of first active region 104, local interconnect 130C to source of second active region 106, and local interconnect 130D to output (drains) of both active regions.

In certain embodiments, second resist pattern 128, as shown in FIG. 8, is formed using a two mask, double patterning process. Two masks may be needed because the features in second resist pattern 128 are below the resolution of the instrument used to deposit the resist (e.g., the stepper). For example, features in the resist pattern may be 32 nm, 22 nm, 15 nm half-pitch features.

As shown in FIG. 8, second resist pattern 128 has opening 129 located above gate 102 such that the opening is aligned with the gate with the opening being slightly wider than the gate. Opening 129 in second resist pattern 128 is slightly wider than gate 102 to provide tolerance in the alignment of the opening to the gate.

Figure 9:
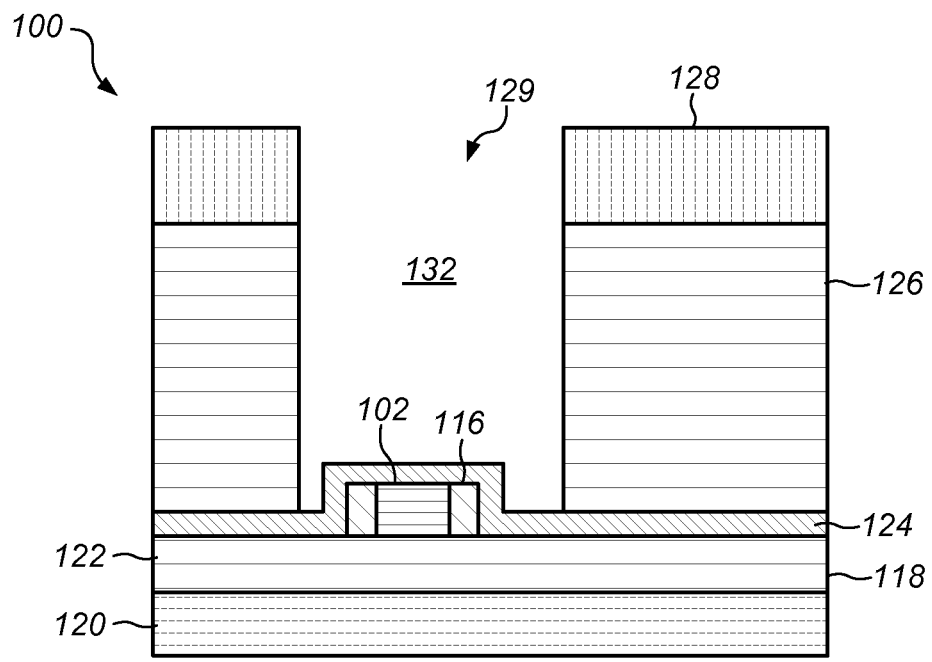
FIG. 9 depicts a cross-sectional side view of an embodiment of a gate of a transistor with a trench formed through an insulation layer deposited over the transistor.
Figure 10:
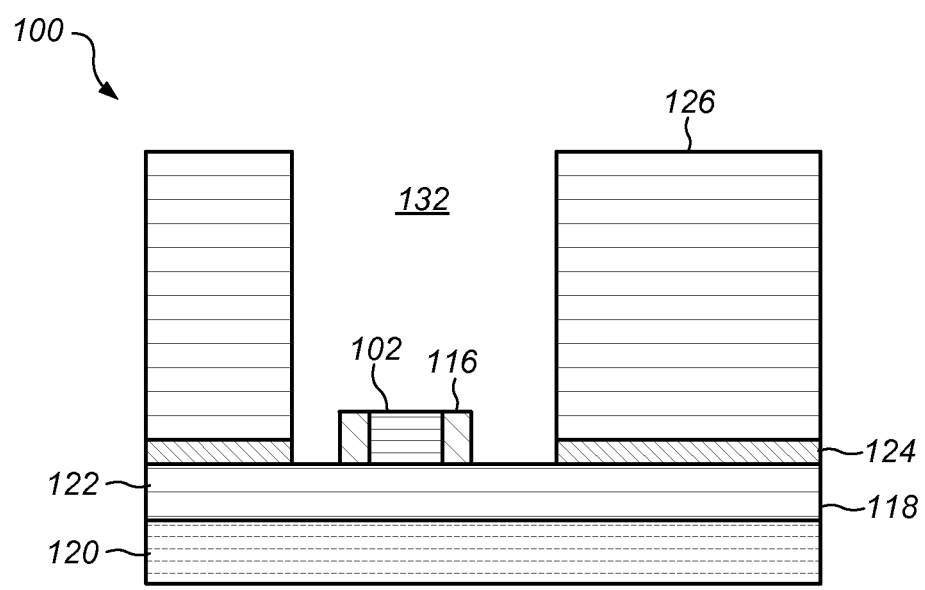
FIG. 10 depicts a cross-sectional side view of an embodiment of a gate of a transistor with a trench formed through an insulation layer and a contact etch stop layer deposited over the transistor.

Second resist pattern 128 is used as a pattern for etching of second insulating layer 126 and/or first insulating layer 124. FIG. 9 depicts removal (etching) of second insulating layer 126 to form trench 132 down to first insulating layer 124. FIG. 10 depicts removal (etching) of first insulating layer 124 to expose gate 102 in trench 132. In some embodiments, second resist pattern 128 is removed before removal of first insulating layer 124. In some embodiments, second resist pattern 128 is removed after removal of first insulating layer 124.

Figure 11:
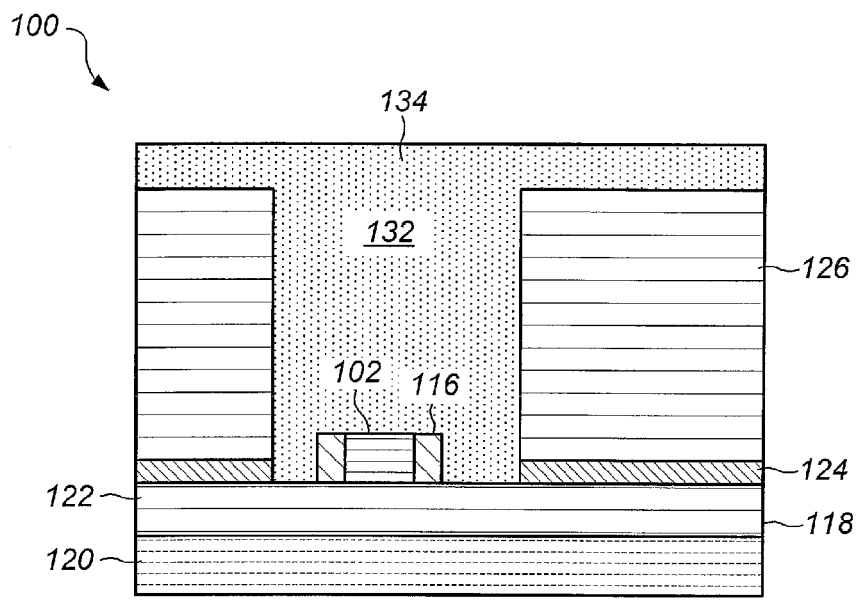
FIG. 11 depicts a cross-sectional side view of an embodiment of a gate of a transistor with a trench formed through an insulation layer and a conductive material deposited in the trench.

After gate 102 is exposed in trench 132, conductive material 134 is deposited on substrate 118, as shown in FIG. 11. As shown in FIG. 11, conductive material 134 fills trench 132. Conductive material 134 may overflow out of trench 132 and onto the upper surfaces of second insulating layer 126. Allowing conductive material 134 to overflow ensures filling of trench 132 with the conductive material.

Figure 12:
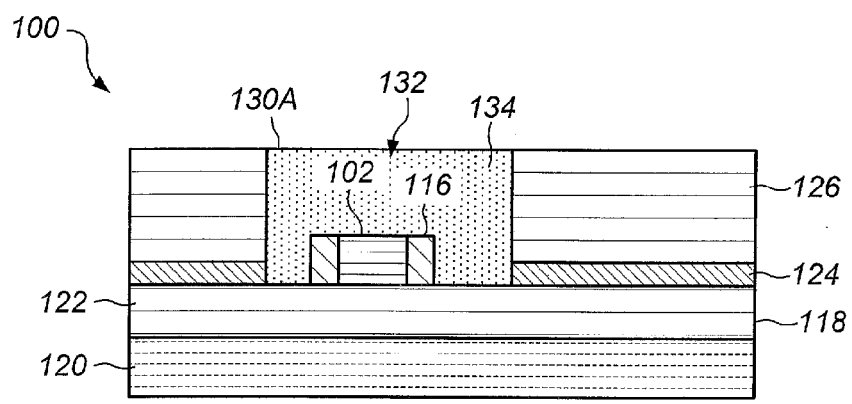
FIG. 12 depicts a cross-sectional side view of an embodiment of a gate of a transistor with a trench filled with conductive material and an insulation layer after planarization.
Figure 14:
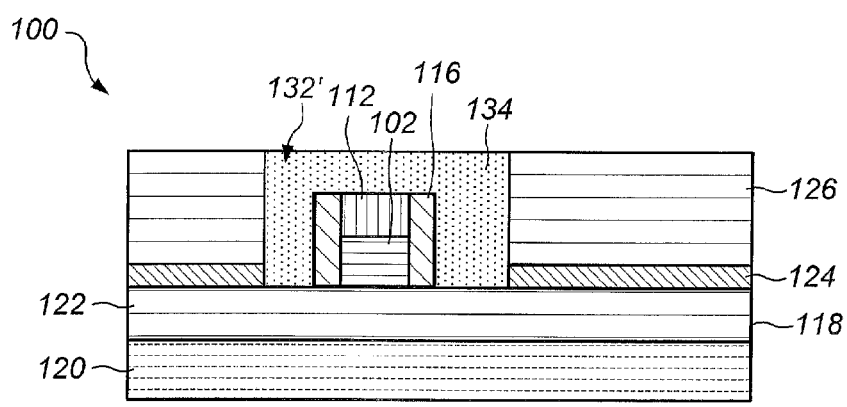
FIG. 14 depicts a cross-sectional side view of an embodiment of a portion of a gate still having a gate hard mask following deposition of a conductive material into a trench after planarization.

Following deposition of conductive material 134, portions of the conductive material and second insulating layer 126 may be removed to form a substantially planar surface with the conductive material in trench 132 and upper surfaces of the second insulating layer exposed, as shown in FIG. 12. Planarization of conductive material 134 and second insulating layer 126 may be accomplished by, for example, chemical mechanical polishing (CMP). Conductive material 134 in trench 132 forms local interconnect 130A to gate 102, also shown from the top view in FIG. 1. FIG. 14 depicts a cross-sectional side view of an embodiment of a portion of gate 102 still having gate hard mask 112 following deposition of conductive material 134 into trench 132' after planarization. Because of the presence of gate hard mask 112, no connection to gate 102 is made with conductive material 134. Conductive material 134 in trench 132' may be used to provide a routing layer over the field oxide and/or make local connections in a library cell.

Figure 13A:
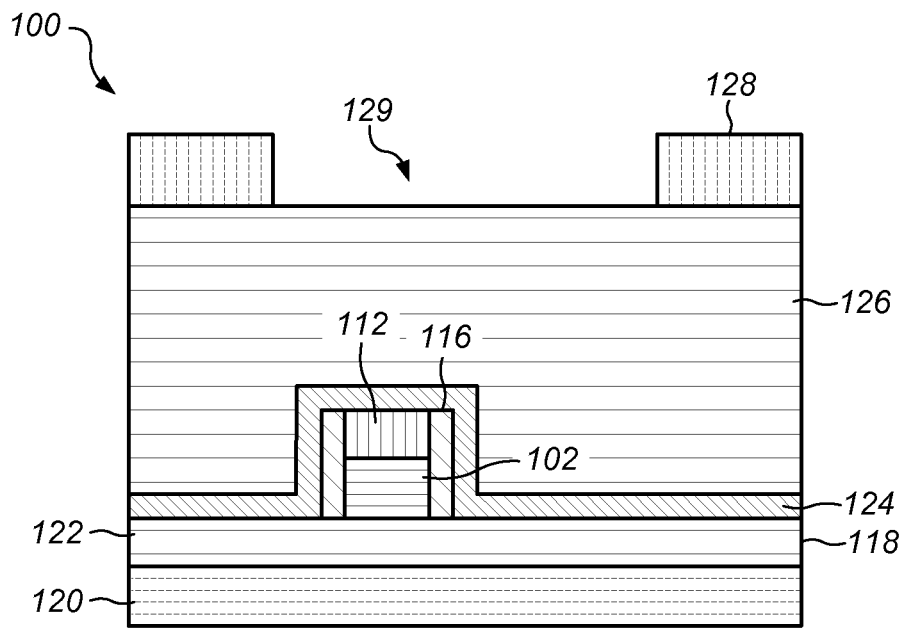
FIGS. 13A-J depict an alternative embodiment of a process for forming a local interconnect to a gate.

FIGS. 13A-J depict an alternative embodiment of a process for forming a self-aligned local interconnect to gate 102. The embodiment depicted in FIGS. 13A-J may utilize similar processes and/or techniques as the embodiment depicted in FIGS. 2-12 with a variation in the order of process steps. In the embodiment depicted in FIGS. 13A-J, first insulating layer 124 and second insulating layer 126 are deposited on the substrate prior to removal of gate hard mask 112. FIG. 13A depicts transistor 100 with gate hard mask 112 on gate 102 and first insulating layer 124 and second insulating layer 126 deposited over the gate. Second resist pattern 128 has opening 129 located substantially over the gate.

Figure 13B:
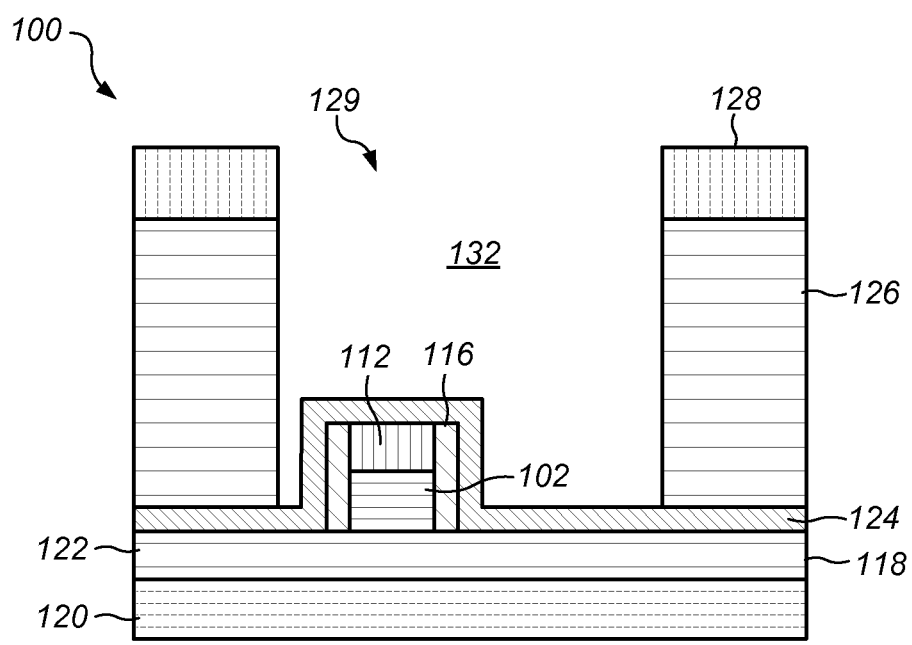
Figure 13C:
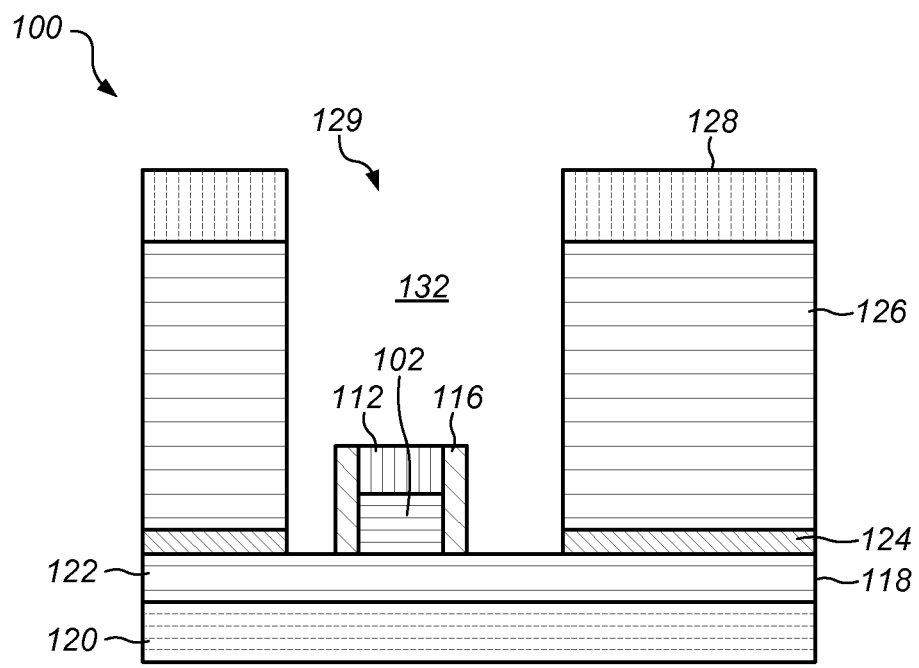
Figure 13D:
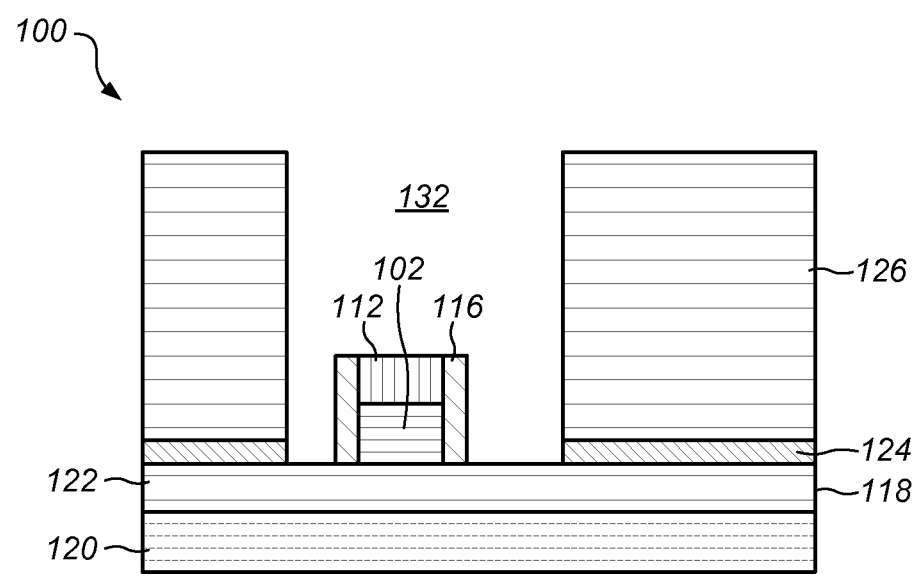

FIG. 13B depicts transistor 100 after trench 132 is etched in second insulating layer 126 through opening 129 in second resist pattern 128. FIG. 13C depicts the removal of first insulating layer 124 in trench 132. FIG. 13D depicts the removal of second resist pattern 128.

Figure 13E:
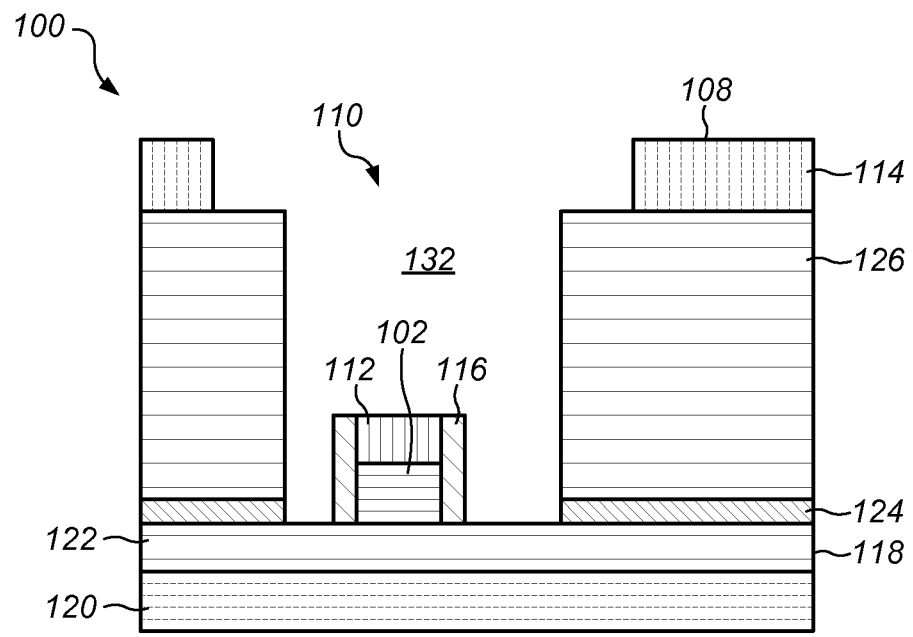
Figure 13F:
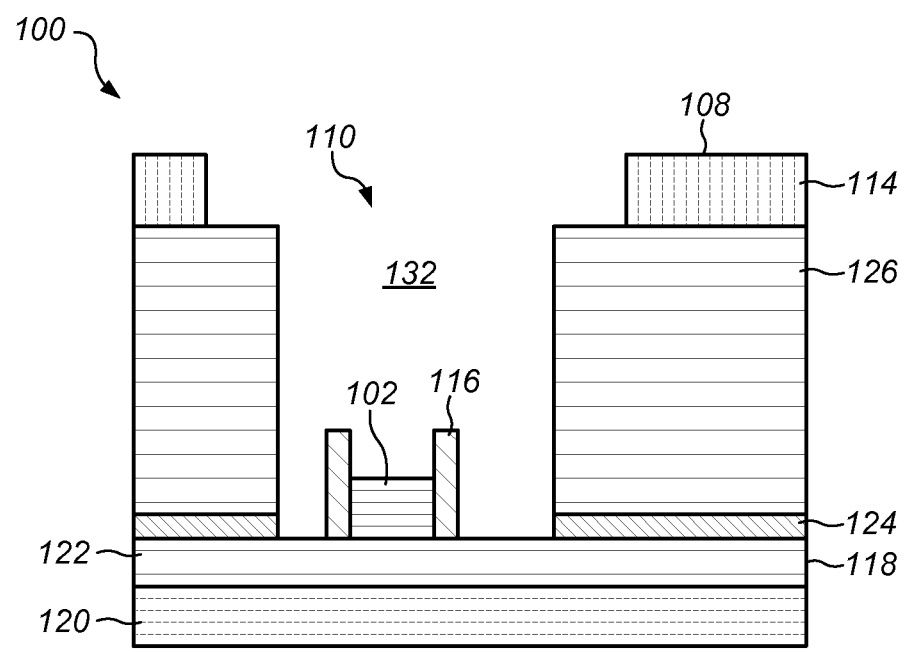
Figure 13G:
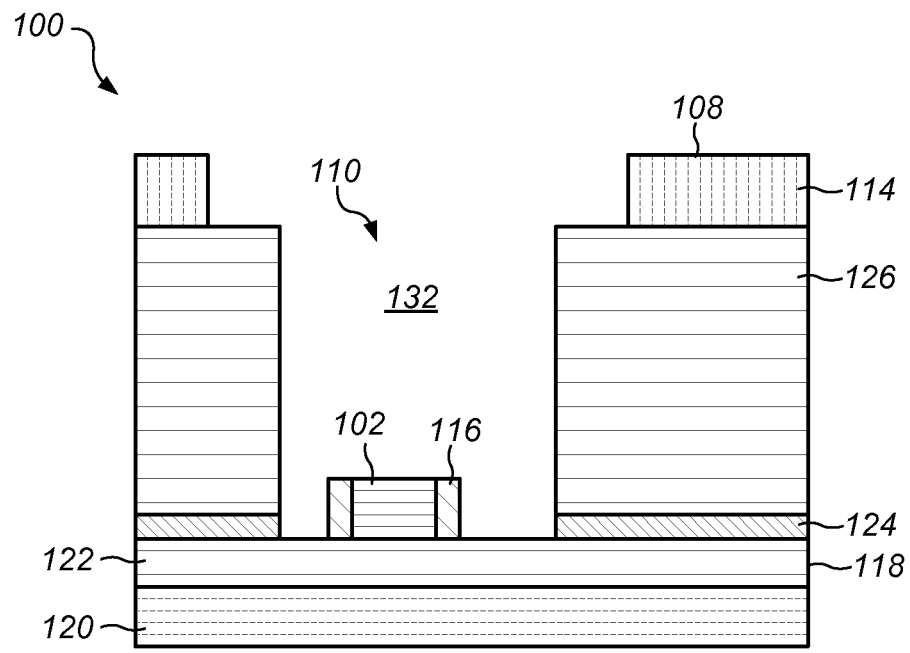
Figure 13H:
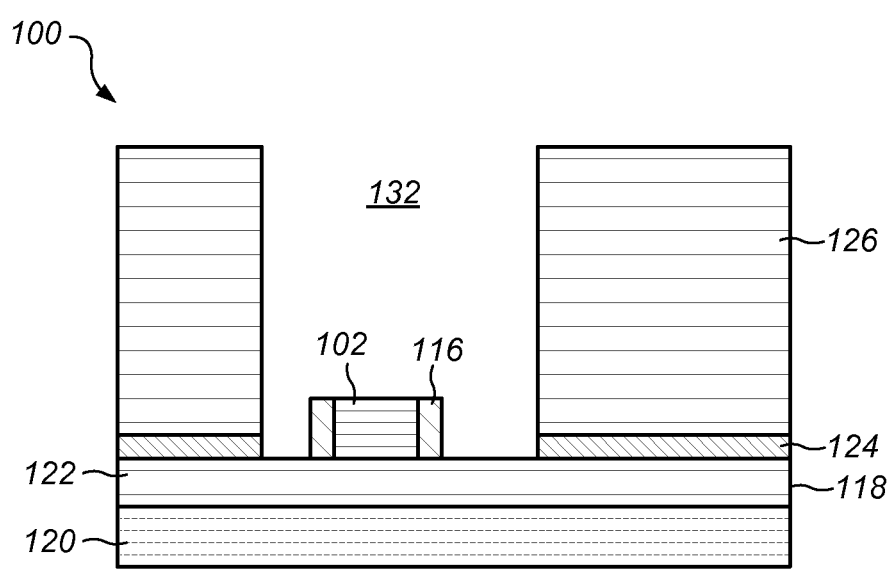

In FIG. 13E, first resist pattern 108 with opening 110 is formed with resist 114 on second insulating layer 126. Gate hard mask 112 is then selectively etched through opening 110 to expose gate 102 inside spacer 116, as shown in FIG. 13F. Spacer 116 is then etched back to be substantially planar with gate 102, as shown in FIG. 13G. Resist 114 is then removed, as shown in FIG. 13H.

Figure 13I:
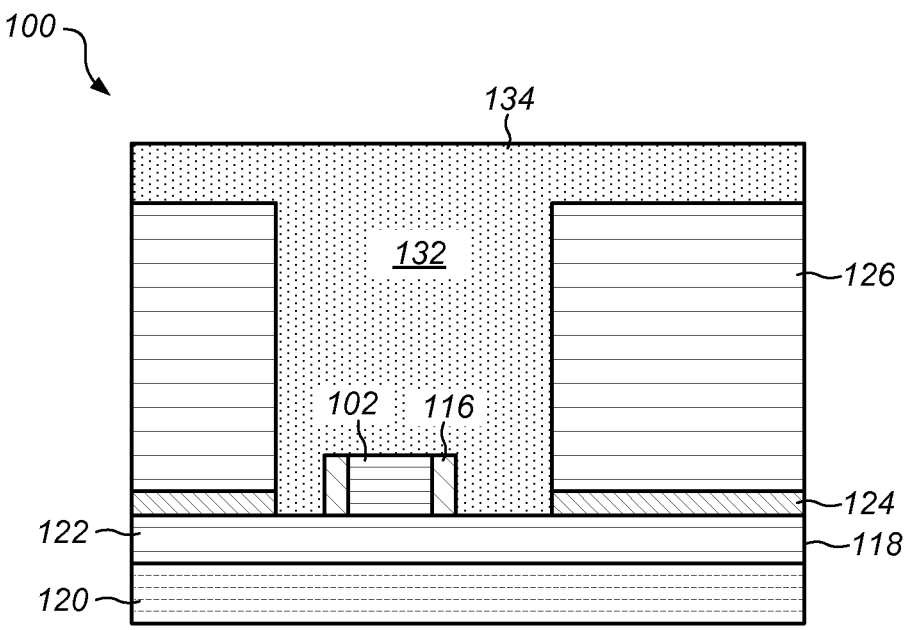
Figure 13J:
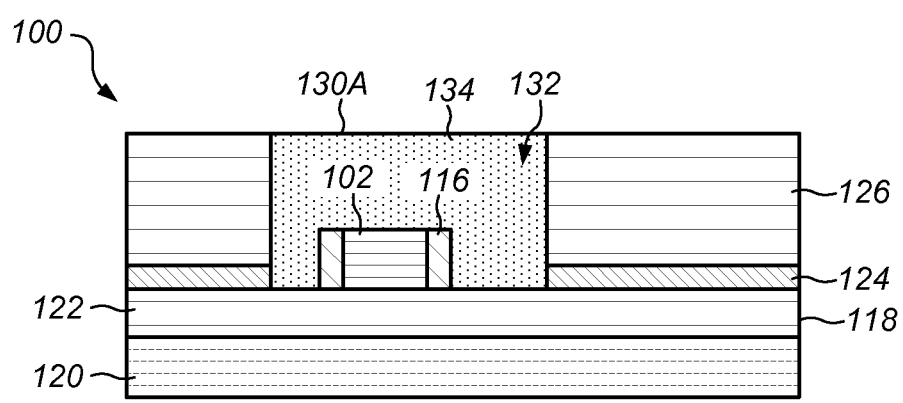

After removal of the resist, conductive material 134 is deposited in trench 132, as shown in FIG. 13I. Conductive material 134 and second insulation layer 126 are then planarized to form local interconnect 130A, shown in FIG. 13J.

After formation of local interconnect 130A, the local interconnect may be connected to a via interconnect. The via interconnect may be used to make connection to an upper metal layer (e.g., a metal 1 layer) or other desired layer through a via layer as is known in the art.

The formation of local interconnect 130A, which is self-aligned to gate 102, in combination with local interconnects 130B, 130C, and 130D, shown in FIG. 1, through the use of first resist pattern 108 and second resist pattern 128 (shown in FIGS. 8 and 9) allows a more dense library cell to be developed for transistor 100. Additionally, it may be possible to develop more dense SRAM (static random access memory cells) using the process embodiments depicted in FIGS. 2-12 and FIGS. 13A-J.

The process embodiments depicted in FIGS. 2-12 and FIGS. 13A-J may produce self-aligned local interconnect to gate in combination with a reduced number of masks and/or steps as compared to using other process flows or using a self-aligned contact flow instead of local interconnect. The self-alignment of the local interconnect to gate may inhibit contact to gate shorts.

It is to be understood that it may be possible to use the process embodiments depicted in FIGS. 2-12 and FIGS. 13A-J to produce self-aligned contacts to a gate instead of the self-aligned local interconnect to gate. Although there may be variations in some of the steps described herein, it would be obvious to one of skill in the art to produce self-aligned contacts using the processes described herein.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed:

1. A semiconductor device fabrication process, comprising:
    selectively removing a hard mask in one or more selected regions over a gate of a transistor on a semiconductor substrate, wherein removal of the hard mask in the selected regions allows the gate to be connected to an upper metal layer through at least one insulating layer located substantially over the transistor; and
    depositing conductive material in one or more trenches formed through the at least one insulating layer, wherein at least one trench is aligned over the gate, wherein the at least one trench is wider than the gate with two sides of the gate being exposed in the at least one trench, and wherein the conductive material forms a local interconnect to the gate in at least one of the selected regions.

2. The process of claim 1, wherein the selective removal of the hard mask is accomplished using a CAD (computer-aided design) designed resist pattern that defines the selected regions.

3. The process of claim 1, wherein the selected regions comprise regions located above the gate at desired locations for making connections to the gate through the at least one insulating layer.

4. The process of claim 1, wherein the conductive material is deposited into at least one trench formed through the at least one insulating layer above a region where the hard mask has not been removed, and wherein the hard mask inhibits connection between the conductive material and the gate in such trench.

5. The process of claim 1, further comprising connecting the gate to the upper metal layer using at least one via interconnect through at least one additional insulation layer.

6. The process of claim 1, further comprising removing at least portion of a spacer surrounding the gate in at least one of the selected regions such that a top surface of the spacer is substantially planar with a top surface of the gate.

7. The process of claim 1, further comprising removing at least a portion of the conductive material and the at least one insulating layer to form a substantially planar surface on the substrate.

8. A semiconductor device fabrication process, comprising:
    forming a gate of a transistor on a semiconductor substrate using a hard mask;
    placing a gate hard mask etch pattern over the transistor;
    selectively removing the hard mask in one or more selected regions over the gate using the gate hard mask etch pattern;
    forming one or more insulating layers over the transistor;

forming a trench through at least one of the insulating layers in at least one of the selected regions over the gate such that the gate is exposed in the trench, wherein the trench is wider than the gate with two sides of the gate being exposed in the trench; and depositing conductive material in the trench, wherein the conductive material forms a local interconnect to the gate in at least one of the selected regions.

9. The process of claim 8, wherein the one or more insulating layers comprises two insulating layers.

10. The process of claim 8, further comprising removing the gate hard mask etch pattern after selectively removing the hard mask in the one or more selected regions.

11. The process of claim 8, wherein the gate hard mask etch pattern is a CAD designed resist pattern that defines the selected regions.

12. The process of claim 8, further comprising connecting the gate to an upper metal layer using at least one via interconnect through at least one additional insulation layer.

13. A semiconductor device fabrication process, comprising:

forming a gate of a transistor on a semiconductor substrate using a hard mask;

forming one or more insulating layers over the transistor;

forming a trench through at least one of the insulating layers in at least one of the selected regions over the gate such that the gate and the hard mask are exposed in the trench, wherein the trench is wider than the gate with two sides of the gate being exposed in the trench;

placing a gate hard mask etch pattern over the transistor;

selectively removing the hard mask in the selected regions over the gate using the gate hard mask etch pattern; and depositing conductive material in the trench, wherein the conductive material forms a local interconnect to the gate in at least one of the selected regions.

14. The process of claim 13, wherein the gate hard mask etch pattern is a CAD designed resist pattern that defines the selected regions.

15. The process of claim 1, wherein at least two walls of the at least one trench are spaced at least some distance from the gate.

16. The process of claim 1, wherein at least some portion of the substrate on opposite sides of the gate in the at least one trench is exposed.

17. The process of claim 8, further comprising forming the trench with at least two walls of the trench being spaced at least some distance from the gate.

18. The process of claim 8, further comprising exposing at least some portion of the substrate on opposite sides of the gate in the trench.

19. The process of claim 13, further comprising forming the trench with at least two walls of the trench being spaced at least some distance from the gate.

20. The process of claim 13, further comprising exposing at least some portion of the substrate on opposite sides of the gate in the trench.

\* \* \* \* \*